United States Patent [19]

Anger et al.

[11] 4,136,285
[45] Jan. 23, 1979

[54] METHOD FOR IRRADIATING A SPECIMEN BY CORPUSCULAR-BEAM RADIATION

[75] Inventors: Klaus Anger; Burkhard Lischke; Andreas Oelmann; Helmut Reschke, all of Berlin, Germany

[73] Assignee: Siemens Aktiengesellschaft, Munich, Germany

[21] Appl. No.: 732,645

[22] Filed: Oct. 15, 1976

[30] Foreign Application Priority Data

Oct. 17, 1975 [DE] Fed. Rep. of Germany ....... 2547079

[51] Int. Cl.² ............................................. H01J 37/00
[52] U.S. Cl. ................................. 250/492 A; 250/398
[58] Field of Search .................. 250/492 A, 398, 306; 219/121 EB, 121 EM; 313/361, 426

[56] References Cited

U.S. PATENT DOCUMENTS

| | | | |
|---|---|---|---|
| 3,770,934 | 11/1973 | Randmer | 219/121 EB |
| 3,914,608 | 10/1975 | Malmberg | 250/492 A |
| 3,924,136 | 12/1975 | Heynick et al. | 250/492 A |
| 4,021,674 | 5/1977 | Koops | 250/492 A |

Primary Examiner—Bruce C. Anderson
Attorney, Agent, or Firm—Kenyon & Kenyon, Reilly, Carr & Chapin

[57] ABSTRACT

A method for irradiating a specimen by corpuscular-beam radiation in which an irradiated surface pattern including isolated areas unexposed to the corpuscular beam surrounded at least almost completely by areas exposed to the beam is generated on a specimen by first imaging a mask which is supported by a support grid comprising a plurality of parallel strips and having a pattern corresponding to the surface pattern to be generated, on the specimen by shadow projection by means of a corpuscular beam consisting of a plurality of parallel rays. The image of the supporting grid is then removed by tilting the corpuscular beam in a direction perpendicular to the longitudinal axis of the strips forming the support grid through an angle which is at least equal in radians to the ratio of the width of the strips to the distance between the mask and the specimen.

1 Claim, 3 Drawing Figures

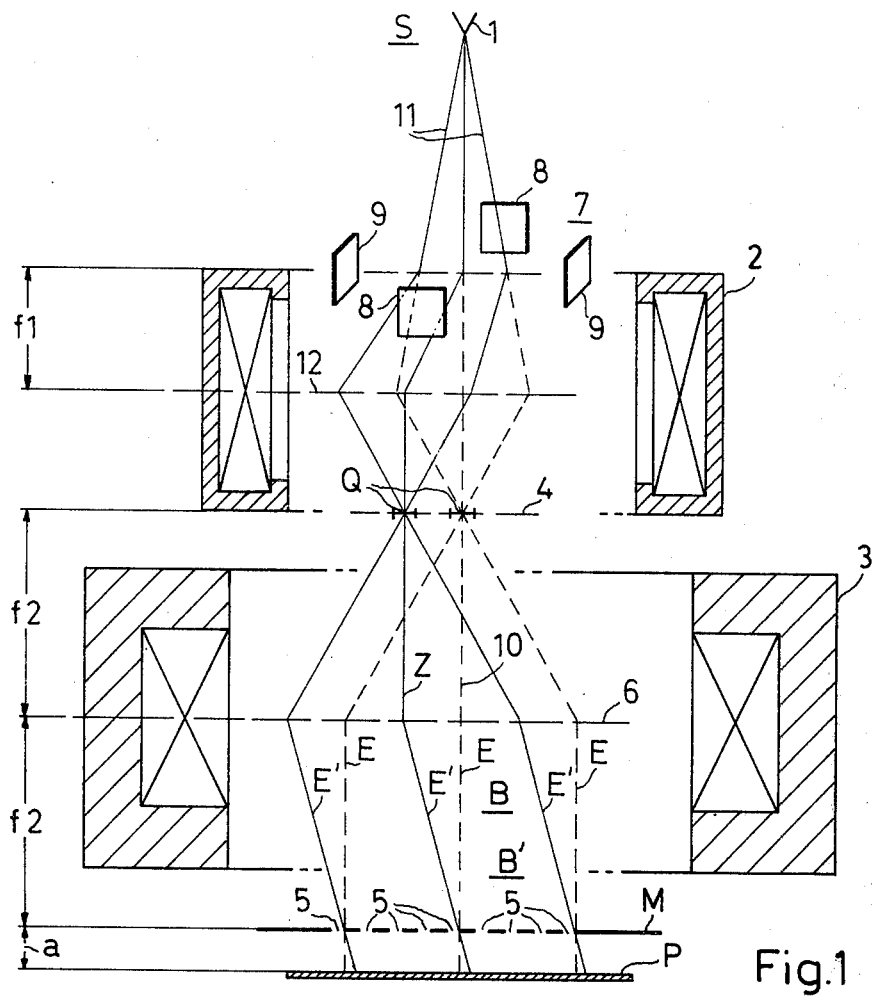
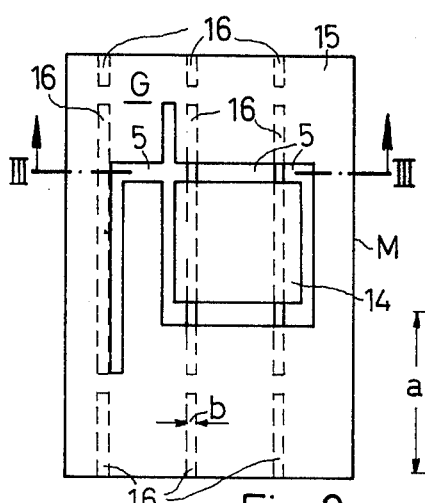
Fig.2
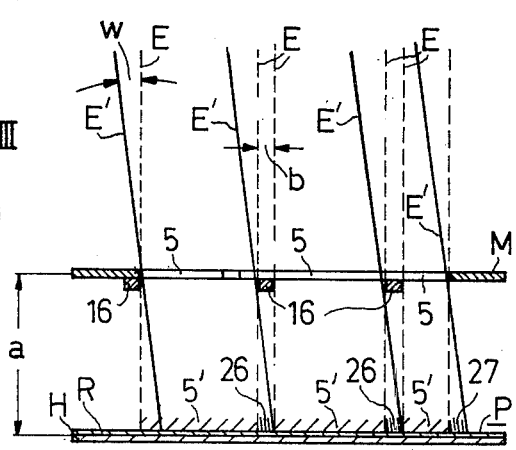
Fig.3

METHOD FOR IRRADIATING A SPECIMEN BY CORPUSCULAR-BEAM RADIATION

BACKGROUND OF THE INVENTION

1. Field of the Invention

The present invention relates generally to an improved method for irradiating a specimen by corpuscular-beam radiation.

2. Description of the Prior Art

Methods for irradiating a specimen by corpuscular-beam radiation in the form of a surface pattern having areas unexposed to the beam which are surrounded at least almost completely by areas exposed to the beam and in which a mask having a pattern corresponding to the surface pattern to be generated and a support grid comprising a plurality of parallel strips which support the areas of the mask corresponding to the unexposed areas of the surface pattern are uniformly illuminated by a corpuscular beam, and in which the image of the mask is optically shifted at least approximately perpendicular to the strips of the support grid by a distance which is at least equal to the width of the strips, are known in the art. Such a method is described in pending patent application Ser. No. 617,062, filed on Sept. 26, 1975 entitled "Improved Charged Particle Beam Optical Appartus for Irradiating a Specimen in a Two Dimensional Pattern" now U.S. Pat. No. 4,021,674.

In the known method, the problem of causing the image of the support grid to disappear is solved. In order to achieve this, the image of the mask is intermittently deflected by a deflection system located behind the mask along the beam path.

SUMMARY OF THE INVENTION

It is an object of the present invention to provide an improved method for irradiating a specimen by corpuscular-beam radiation which also solves the problem of causing the image of the support grid to disappear.

These and other objects of the invention are achieved in a method for irradiating a specimen by corpuscular-beam radiation in a surface pattern having areas unexposed to the beam surrounded at least almost completely by areas exposed to the beam, and in which a mask having a pattern corresponding to the surface pattern to be generated and a support grid comprising a plurality of parallel strips which support areas of the mask corresponding to the unexposed areas of the surface pattern are uniformly illuminated by the beam, and in which an image of the mask is optically shifted at least approximately perpendicular to the strips of the support grid by a distance which is at least equal to the width of the strips. The improvement of the invention comprises the steps of illuminating the mask by a corpuscular-ray beam consisting of a plurality of parallel corpuscular rays, imaging the mask on the specimen by means of shadow projection, and tilting the corpuscular-ray beam in a direction perpendicular to the longitudinal axis of the strips of the support grid through an angle which is at least equal in radians to the ratio of the width of the strips to the distance between the mask and the specimen.

The image of the mask is deflected by tilting the corpuscular-ray beam in front of the mask along the beam path and the specimen can, thus, be disposed at a small distance behind the mask, i.e., a distance of a few millimeters behind the mask, along the beam path. The axial dimensions of the apparatus which are required to implement the described irradiation method then become quite small.

These and other novel features and advantages of the invention will be described in greater detail in the following detailed description.

BRIEF DESCRIPTION OF THE DRAWINGS

In the drawings, wherein similar reference numerals denote similar elements throughout the several views thereof:

FIG. 1 is a schematic illustration of an electron beam projection apparatus for carrying out an improved method for irradiating a specimen by a corpuscular beam according to the present invention;

FIG. 2 is a partial, plan view of a mask for use in the apparatus illustrated in FIG. 1 for carrying out the improved method according to the present invention; and FIG. 3 is a cross-sectional view of the mask taken along section III—III of FIG. 2.

DETAILED DESCRIPTION

Referring now to the drawings, in particular to FIG. 1, there is shown an electron beam projection apparatus S for imaging a mask on a specimen. The apparatus includes an electron beam source 1 for generating electron beam 11 and a pair of condenser lenses 2 and 3. Lens 2 generates an image Q of the beam source 1 in the image plane 4 of the lens. The forward focal plane of condenser lens 3 coincides with image plane 4 of lens 2. Lens 3, thus, generates a bundle B of mutually parallel electron beam rays E which illuminate a mask M. Beam B travels through mask M at a plurality of points 5 which are permeable to electrons and generates an image of mask M on a specimen P. The specimen is disposed behind mask M along the beam path at a distance a behind the mask. The image of the mask is generated by shadow projection on specimen P in the ratio of 1:1. The distance between the central plane 6 of condenser lens 3 and mask M is chosen to be equal to the focal length f2 of lens 3. Imaging errors of the projection apparatus S are thus kept small and, in addition, such an arrangement assures that mask M will always be illuminated uniformly during tilting of the beam.

A deflection system 7 is disposed ahead of condenser lens 2 along the beam path and comprises two pairs of deflection plates 8 and 9 which are effective at right angles to each other and perpendicular to longitudinal axis 10 of apparatus S. Deflection system 7 enables electron beam 11 to be deflected and a bundle B' of electron rays E' to be generated which strike mask M at an angle with respect to the surface thereof, and the image of the mask on the specimen is thereby shifted. The distance between deflection system 7 and central plane 12 of condenser lens 2 is equal to the focal length f1 of lens 2. The center ray Z of bundle B' is thus parallel to axis 10 of apparatus S between the central planes of condenser lenses 2 and 3.

Deflection of the electron beam and the oblique illumination of the mask causes an electron-impermeable support grid for the mask, which comprises a plurality of parallel strips, to disappear. This effect is illustrated in FIGS. 2 and 3, with FIG. 2 illustrating mask M, which may comprise, for example, copper, and is to be imaged on specimen P. The mask includes electron-permeable areas 5 which permit electrons to pass therethrough and electron-impervious areas 14 and 15. Mask areas 5 which permit the electrons of the beam to pass through the mask are designed, in the illustrated embodiment of the invention, as apertures in the mask and completely surround electron-impervious area 14 of the mask. Mask area 14 is supported by a support grid G comprising a plurality of parallel strips 16 of width b. FIG. 3 is a cross-sectional view of the mask, illustrating passage of the rays of the corpuscular beam through the apertures of the mask. The specimen examined may comprise a semiconductor H covered with an electrosensitive layer of material R, for example, photoresist.

The method for exposing specimen P at those areas which correspond to areas 5 of the mask which are electron-permeable, basically comprises two steps. In the first step, mask M is illuminated by beam B of electron rays E, the latter of which are parallel to each other and are parallel to the longitudinal axis of the apparatus. Specimen P is thus exposed at shaded points 5' which are separated from each other by areas 26 in the shadow of the support grid 16. In order to expose specimen P to the beam at points 26, the electron ray beam is then tilted, the second step of the method, through an angle w in a direction perpendicular to the direction of, i.e., the longitudinal axis of, strips 16. The angle w is equal in radians to the ratio of width b of strips 16 to the distance a between mask M and specimen P. The tilted electron rays of the beam are identified in the drawings by the reference character E'.

After suitable treatment, for example, stirring off the electron-sensitive layer R at points 5' and areas 26, it is possible to produce surfaces on specimen P which are functionally different from the surrounding surfaces. For example, it is possible to dot the free surfaces of the specimen with metal ions. These surfaces may also be designed as insulating surfaces or as conductor paths.

As can be seen from FIGS. 2 and 3, the deflection of the electron optical image of mask 6 results in a widening of the exposed surfaces which are disposed parallel to the direction of support grid 16. Such a surface is identified in the drawings by reference numeral 27 in FIG. 3. If such widening is undesirable, it is possible, as shown in FIG. 2, to reduce the width of this surface according to areas 5 of the mask by an amount equal to the width of strips 16 of the support grid.

The mask may also be supported by an additional support grid, besides support grid 16 illustrated in the drawings, which is disposed perpendicular to grid 16. Such a grid provides increased mechanical stability for the mask. It should be noted that if two support grids are utilized for supporting mask M, the electron ray beam which illuminates the mask must also be tilted in a direction perpendicular to the direction of the strips of the second support grid through an angle which, in radians, is equal to the ratio of the width of the strips of the second support grid to the distance a between the mask M and specimen P. Both of these tilting motions of the electron beam may be carried out simultaneously. In such an arrangement, tilting of the electron beam at an angle with respect to both support grids is produced.

It should be noted that although the invention is particularly applicable to electron-optical projection apparatus, particularly apparatus for fabricating microcircuits or integrated circuits on a semiconductor base, the invention may also be utilized in ion-optical irradiation equipment.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. In a method for irradiating a specimen by corpuscular beam radiation in a surface pattern having areas unexposed to said beam surrounded at least almost completely by areas exposed to said beam and in which a mask having a pattern corresponding to the surface pattern to be generated and a support grid comprising a plurality of parallel strips which support areas of said mask corresponding to said unexposed areas of said surface pattern are uniformly illuminated by said beam, and in which an image of said mask is optically shifted at least approximately perpendicular to said strips of said support grid by a distance which is at least equal to the width of said strips, the improvement comprising the steps of, illuminating said mask by a corpuscular-ray beam consisting of a plurality of parallel corpuscular rays, imaging said mask on said specimen by means of shadow projection, and tilting said corpuscular-ray beam in a direction perpendicular to the longitudinal axis of said strips of said support grid through an angle which is at least equal in radians to the ratio of the width of said strips to the distance between said mask and said specimen.

* * * * *